United States Patent [19]

Schmedding

[11] Patent Number: 5,046,954

[45] Date of Patent: Sep. 10, 1991

[54] PLANAR ELECTRICAL CONNECTOR

[75] Inventor: George R. Schmedding, Hummelstown, Pa.

[73] Assignee: AMP Incorporated, Harrisburg, Pa.

[21] Appl. No.: 648,718

[22] Filed: Jan. 31, 1991

[51] Int. Cl.[5] .............................................. H01R 9/09
[52] U.S. Cl. ...................................... 439/70; 439/67; 439/593
[58] Field of Search ...................... 439/55, 68, 70, 67, 439/77, 74, 75, 78, 82, 86, 91, 592, 593

[56] References Cited

U.S. PATENT DOCUMENTS

| | | | |
|---|---|---|---|
| 2,958,064 | 10/1960 | Swengel | 439/85 |
| 3,774,140 | 11/1973 | Reimer | 439/593 X |
| 4,187,388 | 2/1980 | Roberts | 439/592 X |
| 4,241,277 | 12/1980 | Hintze et al. | 313/500 |
| 4,241,281 | 12/1980 | Morimoto et al. | 313/500 X |
| 4,655,524 | 4/1987 | Etzel | 439/86 X |
| 4,902,235 | 2/1990 | Tonooka | 439/526 X |
| 4,950,173 | 8/1990 | Minemura et al. | 439/82 |

Primary Examiner—Neil Abrams
Assistant Examiner—Khiem Nguyen

[57] ABSTRACT

An electrical connector (20) includes a body (22) having cavities (24) adapted to receive the leads (18) of components such as displays (16) to be interconnected by circuit traces (28) carried on a film (26) on the surface of the body with contact arms (34, 36) formed in the trace material to engage the leads extended therethrough into the cavities (24) and provide an electrical and mechanical connection of the component.

11 Claims, 4 Drawing Sheets

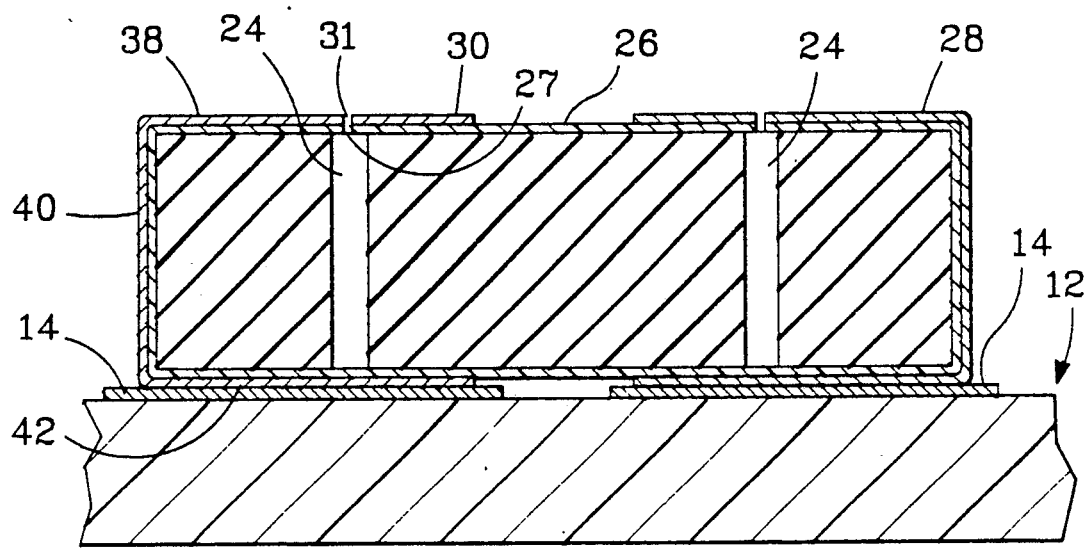
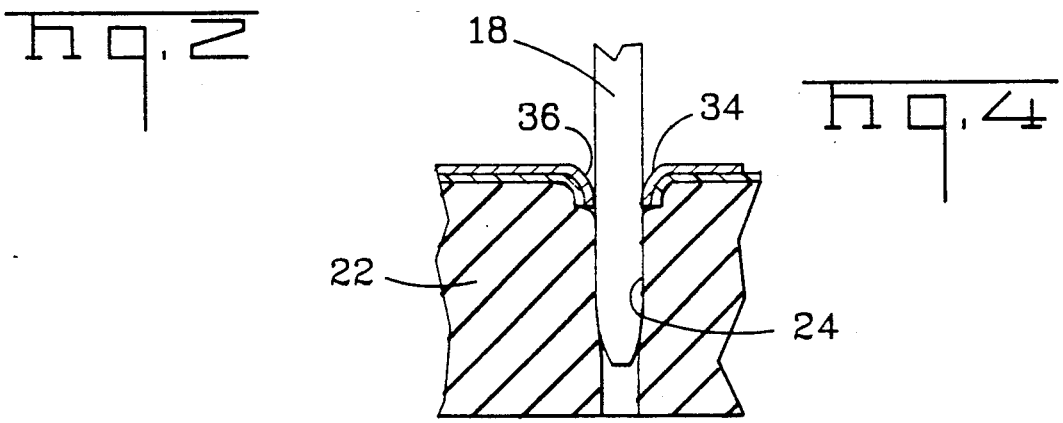
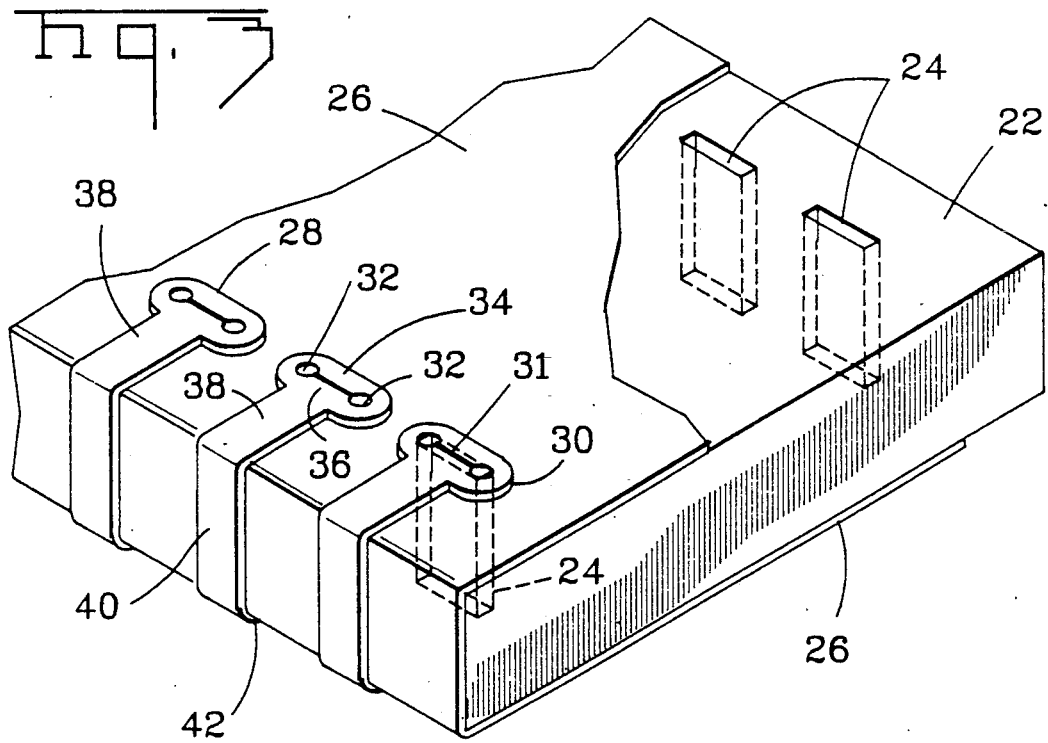

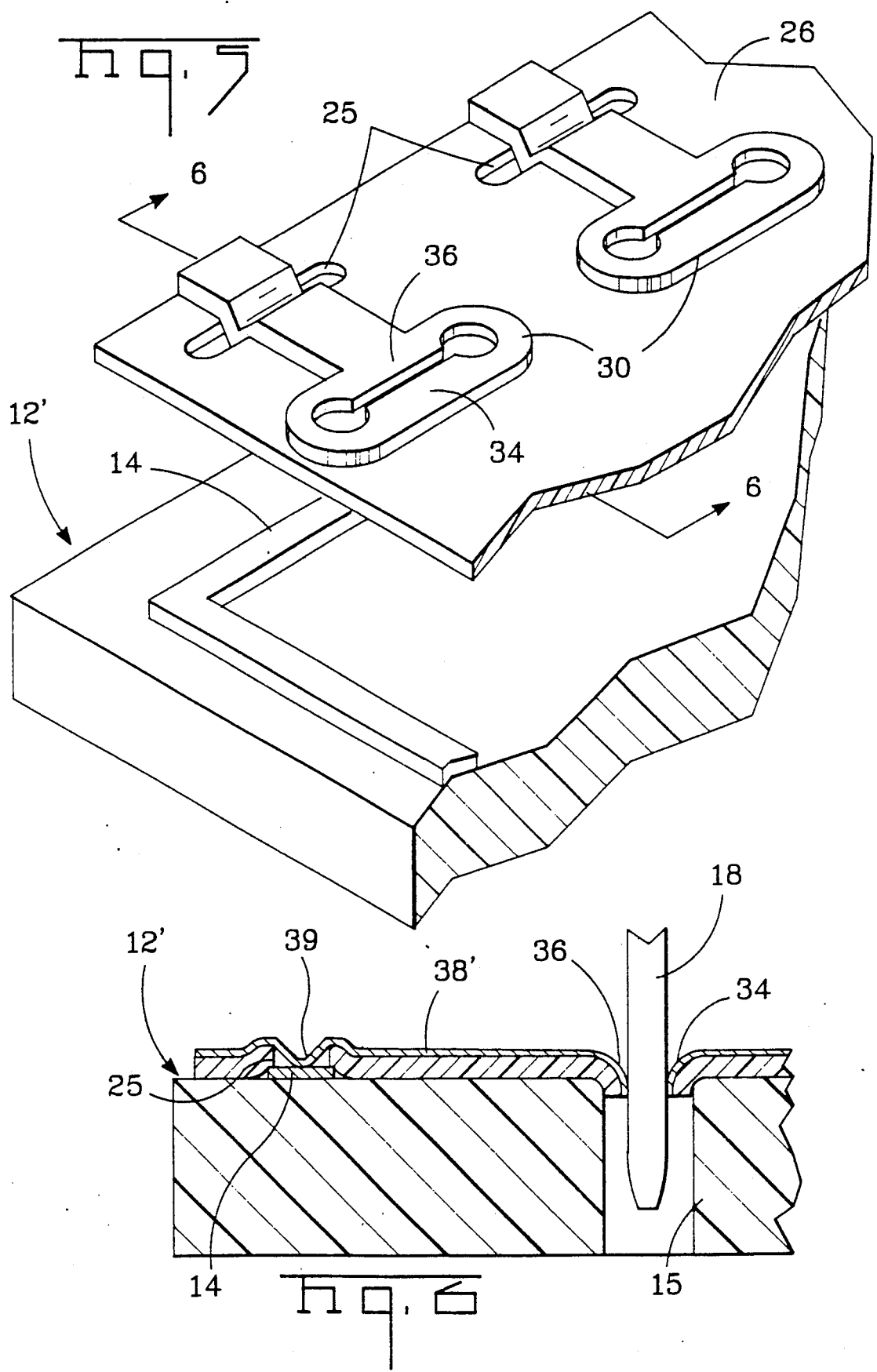

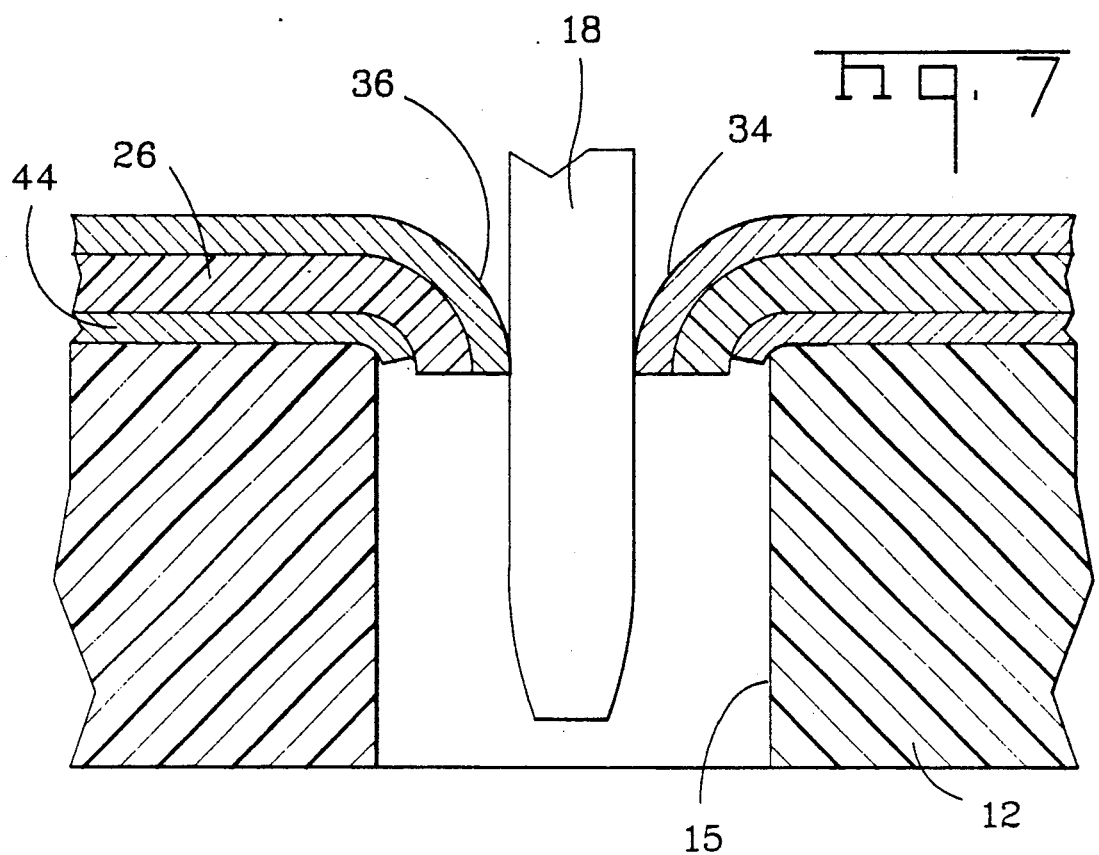
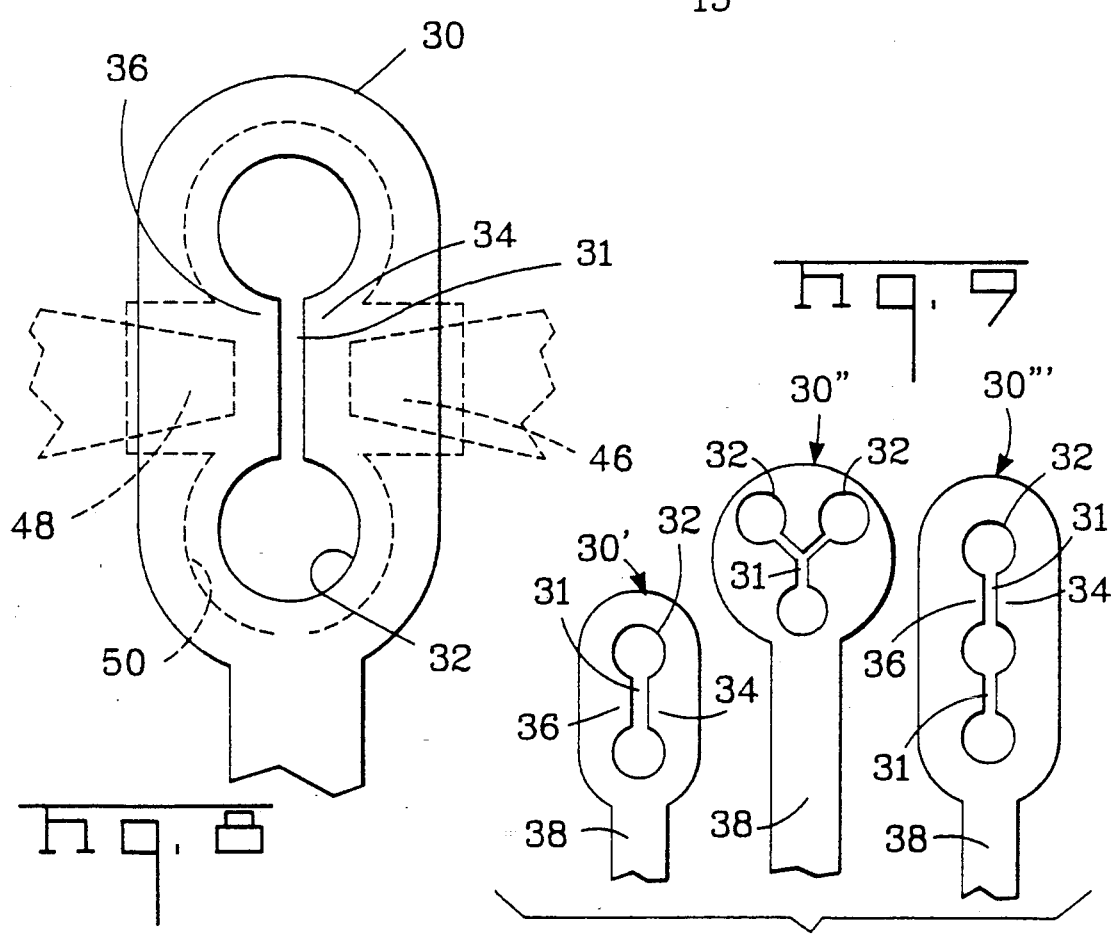

PLANAR ELECTRICAL CONNECTOR

This invention relates to electrical connectors adapted to pluggably receive the leads of electrical or electronic components for interconnection to circuits of a circuit element; the connectors being formed of thin conductive and insulating layers laminated together.

BACKGROUND OF THE INVENTION

Pluggable connectors are widely used to interconnect electrical or electronic form the basis of computers, business machines, communication and scientific equipment and a host of other useful products. Typically, such connectors are formed of conductive material, frequently stamped and formed from sheet stock such as brass or phosphor bronze, and incorporated in some fashion into plastic housings typically molded of dielectric and insulating material. Most frequently, the conductive portions of the connectors are made to include spring sections operable to resiliently engage component leads and provide an interconnection therewith. The trend to high densities for electronic components is driven by the ability of integrated circuits to miniaturize circuit functions which, concomitantly, makes the traditional processes for forming connectors more difficult, both in the stamping, forming, and molding, as well as in the handling and maintenance of production tooling. Additionally, the limitations placed on the dimensions and geometry of the parts, including width and height, imposed by the historical processes, effectively restrain making connectors compatibly smaller for use with the ever smaller components they serve.

U.S. Pat. No. 2,958,064 teaches a circuit board and socket construction for pluggably receiving the leads of components. The invention thereindefined provides a socket through the use of a flexible layer of insulating material laminated to a rigid circuit board, the carrying fingers taught to be of a resilient metal such as phosphor bronze, resilient brass or the like, given a stiffness and resilience to firmly engage the component leads and establish a desirable electrical connection therewith. Apertures in the resilient layer have a smaller diameter than the corresponding diameter of a round component lead inserted therein in order to grip and center the lead for interconnection and support. This patent teaches embodiments wherein the circuit pattern is supported within a cavity in rigid and resilient materials and also wherein the conductive foil is made to extend in cantilevered fashion over the edges of the cavity; both to join a prong-like conductive lead inserted within the socket formed thereby.

U.S. Pat. No. 4,241,277 relates to a light emitting diode (LED) display panel having bus conductors on a flexible support. In this patent a thin conductive foil is laminated to a dielectric film with the foil being given a configuration at selected points to define tap conductors which are displaced transverse to the film by the insertion of a LED to make electrical contact with the electrodes of the LED sandwich. A grating is provided that surrounds individual LEDs and the tap conductors to support the film including the tap conductors. The interconnection of the LED may be covered with a potting compound such as epoxy in order to strengthen the assembly.

It is an object of the present invention to provide a planar interconnection for electrical or electronic component leads that represents an improvement over the inventions of the above-mentioned patents.

A further object is to provide a pluggable electrical interconnection that receives component leads through a laminar construction to form an interconnecting element that no longer need be a barrier to further miniaturization of component to board interconnection systems.

It is yet a further object to provide a pluggable contact that is compatible with use on, and attachable to, circuit boards both in terms of its configuration and in terms of process limitations on dimensions.

It is still a further object to provide a low-profile pluggable interconnection compatible with the configuration and dimensions of integrated circuits and like electronic packages.

SUMMARY OF THE INVENTION

The present invention utilizes a thin, film-like and flexible dielectric and insulating material as the base or carrier for thin conductive traces laminated thereto and having a unique configuration to define pluggable contacts and integral conductive paths extending therefrom. The invention contemplates traditional processes such as lamination of a conductor such as copper foil to the insulating film with a subsequent controlled etching of desired geometries by the use of selectively defined resists and photolithography followed by subtractive processes that take away the unwanted copper foil leaving the desired conductive pattern defined. The invention also contemplates the use of additive processes wherein the conductive traces and contacts are defined and built up by electroless and/or electro-deposited material such as copper. In both instances, the invention contemplates the addition of suitable platings such as gold for high performance interconnections, selectively applied to the contact areas; or, coatings of tin or tin lead useful for less rigorous applications. The invention also contemplates the use of tin lead coatings which may be reflowed by the application of heat once the component leads are plugged into engagement with the contact.

The invention further provides a relief through the removal and shearing of the plastic film and, in certain embodiments, the conductive material, to define short, stiff contact arms which are driven to fold by the insertion of a lead between such arms defining a stiffly resilient conductor-film arm bearing against each side of a component lead and making contact therewith. The arms are defined by forming holes or apertures in the conductive material and film at each end of a slit portion which, together, define the arms. In one embodiment, the film carrying the selectively defined contacts and contact paths is wrapped around an elastomeric body having cavities therein aligned with and compatible with the slit portions of the contact material and with the leads of a component. The cavities receive the leads of a component and the edges of the cavities support the film and contact material for an appropriate bending into the cavity upon lead insertion. The conductive material paths are disposed to be joined to contact paths on the upper surface of a circuit board in a suitable manner such as by solder reflow, conductive adhesive, or a conductive elastomer layer applied to the circuit board or to the paths of the connectors of the invention, as is known in the art.

In a further embodiment of the invention, the film carrying the selective conductive material and contacts is laminated directly to a circuit board with the slit portions of the conductive material aligned with board cavities or apertures so that the leads can be inserted through the connector of the invention thereby folding the arms into the cavity, with the material of the cavity edges supporting such insertion and deformation of the film and conductive portions of the device of the invention. In such embodiment and in other embodiments, the invention contemplates using the integral conductive paths to join two conductive traces or paths on the circuit board surface through the provision of a window beneath the path allowing the conductive path to be joined to the board path in a suitable manner such as by solder reflow, welding, or the use of conductive adhesive and/or elastomeric materials.

In still a further embodiment of the invention, the film and the conductive material forming the contact of the invention is backed up by a thin metallic spring element utilized to increase the normal force of the conductive material bearing against the lead of a component. The spring material may be of a variety of spring grade materials such as stainless steel, phosphor bronze, or the like. Such material is given a definition suitable to perform the function for which it is intended, which definition may be more or less compatible with the definition of the conductive material with respect to the contact arms. It is contemplated that the spring material may be made coextensive with the film except for reliefs that define the spring arms, the holes and slits that define the contacts, at least in one embodiment, with the spring material being itself coated with a dielectric material and utilized for grounding, shielding, and/or impedance definition.

BRIEF DESCRIPTION OF THE DRAWING

FIG. 2 is a side, elevational, and partially sectioned view taken along lines 2—2 of the embodiment of FIG. 1;

FIG. 3 is a perspective view of a section of the connector of FIG. 1 with a portion of the connector of the invention cut away;

FIG. 4 is a sectional and elevational view of the connector of the invention mated to a component lead;

FIG. 5 is a perspective, partially sectioned view, of a corner of an alternative embodiment of the connector of the invention and circuit board;

FIG. 6 is a sectional view of the embodiment shown in FIG. 5 taken along lines 6—6;

FIG. 7 is an elevational and sectional view of another alternative embodiment of the connector of the invention shown in relationship to a circuit board and component lead;

FIG. 8 is a plan view of the connector shown in FIG. 7 prior to insertion of a component lead, with portions shown in phantom; and FIG. 9 is a plan view of further alternative embodiments of the connector of the invention.

DETAILED DESCRIPTION OF THE INVENTION

Figure 1:
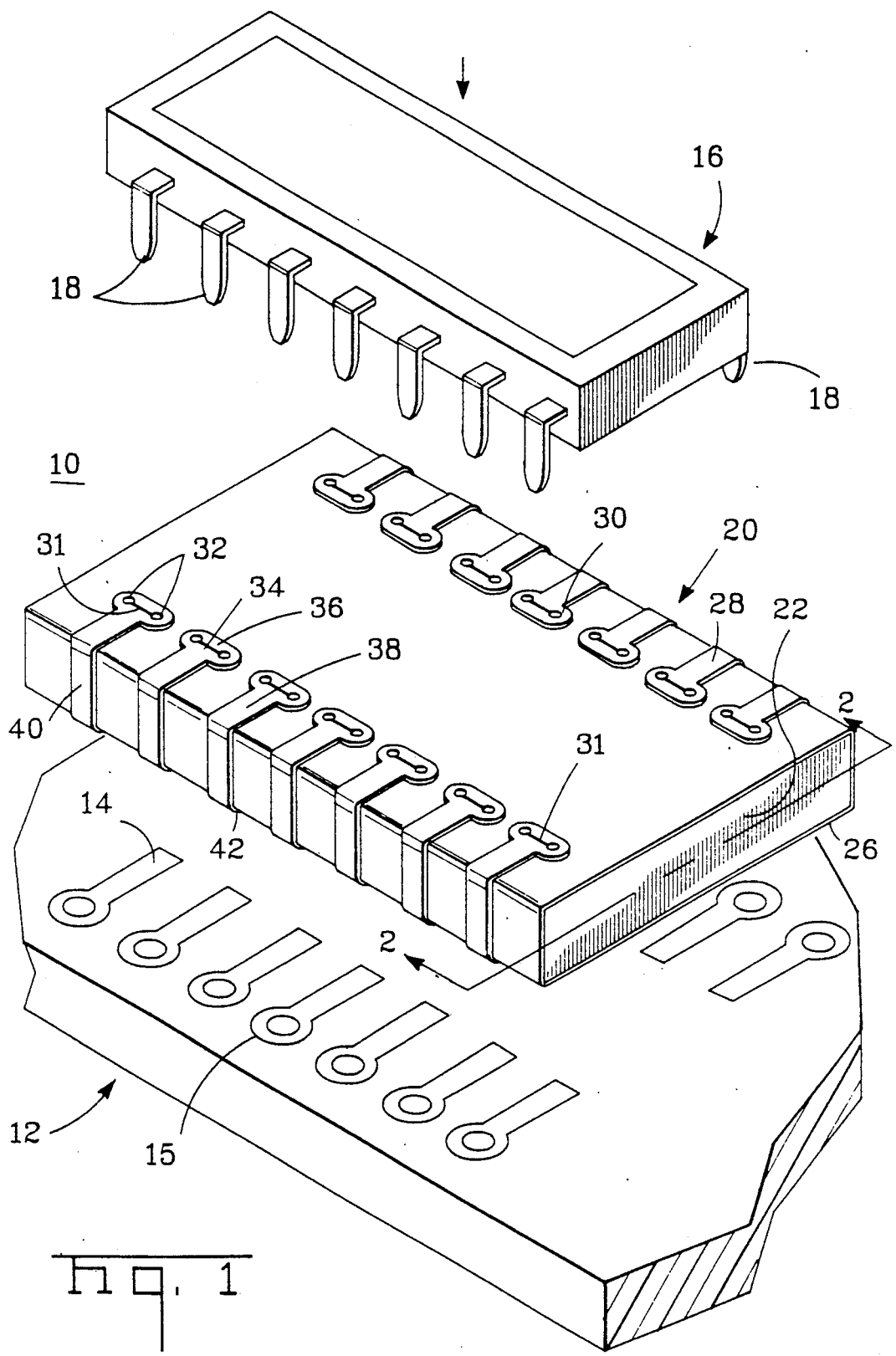
FIG. 1 is a perspective view showing one embodiment of the invention having a circuit board and a mating electronic component exploded therefrom.

FIG. 1 shows an assembly 10, including a circuit board 12, a connector 20 made in accordance with the present invention and an electronic component 16 for mating with connector 20. Circuit board 12 has a series of conductive traces 14 on the upper surface thereof. Traces 14 may further lead to holes or cavities 15, that extend through the board material and may join conductive traces buried within the laminations of board 12 and not shown. As shown in FIG. 1 connector 20 is positioned above the traces 14 preparatory to being mounted to the board 12 and electrically interconnected to respective traces 14, such as by solder, conductive adhesive or other means known in the art. Referring now to FIGS. 1, 2 and 3, connector 20 includes body 22 which, as shown in FIG. 3 includes a series of cavities 24 extending therethrough and a thin film of dielectric material 26 wrapped around the body 22 and having conductive traces 28 including contacts 30 disposed on the surface thereof. The film 26 is slit at 27 in the manner shown in FIG. 2 and the conductive material is separated by slit 31 in the manner shown in FIGS. 1-3 to facilitate the insertion of a component lead. The component 16 as shown in FIG. 1 includes a series of leads 18, two rows of seven such leads being included for illustrative purposes. The leads 18 protrude from the body of component 16 and are defined as thin, flat metallic elements which, in this embodiment, have a tab-like configuration that may be made sufficiently thick or embossed to provide a stiffness sufficient for insertion into sockets and the like. It is to be understood that component 16 may be any one of a number of electronic packages such as an integrated circuit, a readout device, memory module, logic device, or hybrid network contained within a plastic, metal, or ceramic housing. As can be appreciated from FIG. 2, the connector 20 is placed against the upper surface of board 12 with the connector conductive traces 28 thereon being joined to the conductive traces 14 of the board 12. Thereafter, the component 16 may be interconnected to board 12 by having the leads 18 plugged into the individual contacts 30 on the upper surface of the connector 20.

As can be discerned from the connector embodiment revealed in FIGS. 1-4, the connector 20 includes the thin flexible film 26 and conductive material in the form of discrete conductive traces 28 bonded to form a lamination with film 26 and body 22. The thickness of the film 26 and the thickness of the conductive traces 28 is controlled so that the lamination of the two is sufficiently flexible o be wrapped around the body 22 of connector 20. As can be seen particularly in FIGS. 3 and 4, each of the contacts 30 includes a flat contact area penetrated by a pair of holes 32 connected with the slit 31 in the conductive material; all of which are centered to be aligned with the cavities 24 in block 22. The slit 31 is aligned with the slit 27 in film 26 in the manner shown in FIG. 2. The contact area, as modified by apertures 32 and slit 31 defines a pair of contact arms 34 and 36 which, when formed, are in a flat or planar configuration, joined with an integral contact trace 38 extending over the upper surface of connector 20 and down one side and beneath the body of the connector as indicated at 40 and 42, trace portion 42 residing on the bottom of the connector in alignment with, and generally coextensive with, a conductive trace 14 forming part of circuit board 12. In accordance with the invention relative to this embodiment, the portion 42 of the conductive trace of the connector is electrically and mechanically joined to trace 14 and board 12 in a suitable fashion such as by reflowing, solder deposited on the traces 42 and 14, through the application of heat to effect such reflow. Alternatively, conductive adhesives and/or elastomers may be coated on one or both of the traces to form an electrical and mechanical connection when such traces are brought together.

As indicated in FIG. 4, the end of the lead 18 is inserted through the contact 30 deforming the respective contact arms 34 and 36 to define contact areas engaging the sides of 18, and, deforming the film 26 just proximate to slit 31. It has been found that the lamination of a thin conductive material such as a copper foil or deposit with a thin film such as a polyamide or polyester film, when given the configuration of the contact to define short, stubby but resilient, arms provides an excellent electrical connection of low-resistance, long life and stability. In the embodiment shown in FIGS. 1-4, the body 22 of the connector 20 is made of an elastomeric material that is sufficiently resilient to add to the normal force at the contact locations contact by bearing against the film 26 and therethrough the arms 34 and 36 through the deformation of such arms 34,36 inwardly of the cavity 24 in the body 22.

The embodiment shown in FIGS. 1-4 thus provides a planar interconnect of a form which can be manufactured in the flat to be amenable to photolithographic processes, including both additive and subtractive processes for forming conductive traces. Thus, the film 26 may be processed in the flat with a conductive material in the form of a foil, such as copper foil, laminated over the surface thereof, and with the conductive material structures, including the contact area 30 and the legs 38, 40, and 42 defined by etching away the foil between each of the several contacts 30. Alternatively, the conductive material of contacts 30, including the legs 38, 40, and 42, may be built up upon the film 26 by the use of autocatalytic or other material printed in the desired pattern followed by electroless plating and electroplating to build up to a sufficient thickness to carry the currents required by a given component. In both cases, additive or subtractive, copper thicknesses on the order of 0.0014 inches (1 ounce copper) and 0.0028 inches (2 ounce copper) may be readily achieved by existing processes widely used in the circuit board industry. Both conductive materials may be suitably coated with protective finishes, including gold over nickel or, in certain applications, a tin lead which may be subsequently reflowed to form a permanent connection.

In the embodiment shown in FIGS. 1-4, the elastomeric body 22 was formed of a silicon rubber having a hardness on the order of 40A durometer body 22 having the cavities 24 formed therein on appropriate centerlines for component insertion. The thickness of block 22 is on the order of 0.090 inches and the cavities 24 extending through the block were 0.030 inches in length along the surface of the block and 0.015 inches in width. The conductive material 26 was one ounce copper with the contact being defined by apertures on the order of 0.020 inches in diameter and slit 31 was on the order of 0.025 inches in length. The conductive material was defined by subtractive process and was provided with a finish, including a thin coating of gold over a somewhat thicker coating of nickel selectively applied to the arm and contact area. The film 26 utilized for the prototype was of the polyamide family and was on the order of 0.003 inches in thickness. The copper foil of the prototype was laminated to such film with an adhesive widely used in the circuit board industry to laminate copper foil to board materials including phenolic, glass epoxy, and the like. The aforementioned prototype contact was utilized with a component having leads 18 on the order of 0.020 inches in width and 0.010 inches in thickness.

To be appreciated is the fact that the invention provides a planar connector having a low-profile, that provides a pluggable interconnection in materials readily processed by processes offering far fewer limitations on size than that offered by traditional stamping and forming. It is to be understood that the thicknesses of the conductive material, the dielectric film, and the durometer of the block supporting such, along with the dimensions of the cavities can be varied to provide a stiffer, higher force contact, depending upon the surface finishes on the component leads. The invention also contemplates accommodating leads of differing shapes, including those that are round or cylindrical, square or post-like, flat or embossed, or other geometries.

The shape and dimension of the cavities 24 in body 22, is selected in accordance with the type of material used to form body 22 and also the shape and size of the leads 18 being inserted into the cavities 24. When body 22 is made of substantially elastomeric material, the width of cavity 24 can be essentially equal to that of the lead 18 as shown in FIG. 2, thereby increasing normal force. The elastomeric material compresses sufficiently to allow lead 18 to be inserted and lies against lead 18 after insertion. When body 22 is made from more rigid material the dimensions of cavity 24 must be greater than the dimensions of the leads 18 so that the lead 18 may be inserted without damaging contact surfaces 34, 36.

Referring now to FIGS. 5 and 6, an alternative embodiment is shown wherein the film portion 26 of the connector 20, and the contact 30 are essentially as heretofore defined relative to FIGS. 1-4; the difference being in the configuration of leg 38' and the provision of an aperture 25 for each contact. Apertures 25 can be prepunched and formed by removal of material after lamination to foil. The apertures 25 are positioned so that a portion of the leg 38' from each contact 30 can be pressed down to be soldered as by reflow or welded at 39 to the conductive trace 14 that is configured to pass beneath film 26 proximate aperture 25. Not shown, but included in the structure of FIGS. 5 and 6, are additional traces for the additional contacts. With respect to the embodiment of FIGS. 5 and 6, the board cavities 15 and the board edge surfaces proximate the top surface of such apertures are dimensioned to accommodate the legs or arms 34 and 36 upon the insertion of a lead 18 deforming such arms into the aperture 15. In accordance with the invention in this embodiment, the film 26 may be made to be relatively thicker than the film utilized in the embodiments of FIGS. 1-4. Additionally, the film may be made to be more resilient to provide the additional spring force or resiliency to the contact area provided by the elastomeric area 22 in the previous embodiments. In addition, the conductive material forming contacts 30 may be made to provide a better spring by being made of a harder material than dead soft copper.

FIGS. 7 and 8 show an alternative embodiment of the invention, which has the generalized configuration of the embodiment shown in FIGS. 5 and 6, but additionally adds a lamination 44 to the lamination of film 26 and the contact conductive materials 30. The lamination 44 is, in accordance with this embodiment, made of a thin spring material such as stainless steel to include a pair of arms 46 and 48 underlying the arms 34 and 36. As indicated in FIG. 8, the arms 46 and 48 may be made smaller than, in terms of width, the arms 34 and 36 but sufficient in width and thickness and material characteristics to provide a distinct short, stubby spring biasing the contact arms 34 and 36 against the lead 18 of a component. The view in FIG. 8 shows, in phantom, the relief of the material 44 to provide such springs and to clear the remaining surfaces such as 32 and 31 of the contact 30. It is contemplated that the spring material 44 may be suitably formed and then laminated to the film 26 in alignment with the contact structures, with the apertures 32 in the slit 31 thereafter formed by punching and/or slitting. As indicated from FIGS. 7 and 8, the edges of conductive material 44 should be dimensioned to avoid contact and shorting out of the leads 18 in the event a continuous sheet of conductive material, common to the several contacts, is employed. The invention contemplates providing spring elements defined in 46 and 4 electrically isolated from adjacent springs for adjacent contacts or forming such in a common sheet which may also be utilized for other purposes including grounding, shielding, and/or impedance control.

FIG. 9 shows three alternative embodiments 30', 30", 30''' of contact configuration, each including the holes 32 and slits 31 and each to be laminated and carried by a film, not shown. Thus, an embodiment 30' has a slit 31 parallel to the axis of the leg 38 to provide an overall reduction of width of the contact relative to the embodiment shown in FIGS. 1-4 or FIGS. 5-8. A contact of the orientation of 30' would be useful with round or square posts on close centers. The embodiment 30" includes three holes 32 and three slits 31 to provide three arms defining contact areas. This embodiment may be preferred for relatively large round leads. The embodiment 30''' includes three holes 32 and a pair of slits 31 defining a pair of contact arms 34, 36 having particular utility in electrically commoning adjacent pair of leads; or, alternatively, commoning a lead from a given component to another lead from a different component as for example, in grounding or jumping purposes.

Having now described the invention in terms intended to enable its practice in a number of preferred embodiments, claims which follow are set forth to define what is inventive.

What is claimed is:

1. An electrical connector for pluggably connecting the leads of electrical/electronic component comprising:
    a body having a plurality of cavities arranged in a pattern complementary to the pattern of leads of a component and each of said cavities having a lead receiving entrance and having a cross sectional profile shaped and dimensioned in a selected manner associated with a particular cross sectional shape and dimension of a given said component lead, said cavity having a greater length than said component lead as inserted within said cavity;
    a thin film of insulating material having a series of slits, one for each cavity, said slit being aligned with said corresponding cavity;
    a plurality of conductive traces defined on said film corresponding to the number of component leads, each trace including a contact area substantially larger in dimension than a said entrance of a corresponding cavity to overlie said entrance and extend transversely beyond the periphery thereof,
    each contact area including a slit therein extending transversely to the axis of insertion of the lead through a given slit in said film into a said cavity entrance, each said slit concluding at each end thereof in an enlarged hole to define in said contact area a plurality of short contact arms having contact surfaces engagable by a said lead and operable to be deflected into said cavity entrance upon said lead being inserted into said cavity through said film slit, the peripheral edges of said cavity entrance serving to press said contact arms into engagement with the said lead to provide a low-resistance, stable electrical and mechanical interface therewith.

2. The connector of claim 1 wherein said film is wrapped around said body and includes conductive material in the form of legs joining said contact areas and extending around said body in a position of alignment to be interconnected to circuits of a circuit board.

3. The connector of claim 1 wherein said body is comprised of an elastomeric material positioned to be compressed at side peripheral edges of said cavities to drive said contact arms inwardly in engagement with a respective said lead of said component.

4. The connector of claim 1 wherein the said film is of a flat configuration and each said contact area is integrally joined to a conductive leg extending along a surface portion of said film to a second contact area adapted to be terminated to a conductive trace of a circuit board.

5. The connector of claim 1 wherein said conductive traces are defined by selective removal of conductive material laminated to said film.

6. The connector of claim 1 wherein said conductive traces are formed on said film by an additive process.

7. The connector of claim 1 wherein said film includes additionally a layer of thin spring-grade metal laminated thereto opposite to the said conductive trace, said material being adjacent a surface of said connector and having a profile to define spring portions partially extending beyond said peripheral edges of each said cavity entrances and operable to drive said arms in engagement with a said lead upon lead insertion.

8. The connector of claim 1 wherein said contact area includes at least three holes and at least a pair of slits defining at least a pair of contact arms.

9. The connector of claim 1 wherein said contact area includes at least three holes and at least one Y-shaped slit especially suitable for electrical connection to a square or round shaped lead.

10. The connector of claim 1 wherein said body is comprised of a rigid board with said cavities therein being dimensioned to support said film and contact area for deformation of said arms into said cavity by the insertion of said lead therein.

11. The connector of claim 1 wherein said body is a circuit board.

* * * * *